United States Patent
Inomata

(10) Patent No.: US 7,868,420 B2
(45) Date of Patent: Jan. 11, 2011

(54) SEMICONDUCTOR DEVICE WHICH INCLUDES A CAPACITOR AND AN INTERCONNECTION FILM COUPLED TO EACH OTHER AND A MANUFACTURING METHOD THEREOF

(75) Inventor: Daisuke Inomata, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 389 days.

(21) Appl. No.: 12/014,331

(22) Filed: Jan. 15, 2008

(65) Prior Publication Data

US 2008/0135979 A1 Jun. 12, 2008

Related U.S. Application Data

(62) Division of application No. 11/172,973, filed on Jul. 5, 2005, now abandoned.

(30) Foreign Application Priority Data

Jul. 27, 2004 (JP) .............................. 2004-218880

(51) Int. Cl.
*H01L 29/92* (2006.01)
(52) U.S. Cl. ............... 257/532; 257/535; 257/E21.664; 257/E29.343
(58) Field of Classification Search ................. 257/532, 257/535; 438/398, 240, 244
See application file for complete search history.

(56) References Cited

U.S. PATENT DOCUMENTS

| | | | | |
|---|---|---|---|---|
| 6,162,649 A * | 12/2000 | Kweon et al. | .................. | 438/3 |
| 6,200,821 B1 * | 3/2001 | Baek | .............................. | 438/3 |
| 6,201,271 B1 * | 3/2001 | Okutoh et al. | .............. | 257/295 |
| 6,379,977 B1 * | 4/2002 | Sun et al. | ........................ | 438/3 |
| 6,642,100 B2 * | 11/2003 | Yang et al. | .................. | 438/253 |
| 7,294,876 B2 * | 11/2007 | Joo et al. | ..................... | 257/295 |
| 2004/0185635 A1 * | 9/2004 | Tatsunari | ..................... | 438/396 |
| 2004/0262655 A1 | 12/2004 | Kweon | | |
| 2006/0024906 A1 * | 2/2006 | Abe | ........................... | 438/396 |
| 2006/0220083 A1 * | 10/2006 | Abe | ........................... | 257/295 |

FOREIGN PATENT DOCUMENTS

JP 5102153 4/1993

* cited by examiner

*Primary Examiner*—A. Sefer
(74) *Attorney, Agent, or Firm*—Volentine & Whitt, P.L.L.C.

(57) ABSTRACT

A semiconductor device includes a semiconductor substrate and a capacitor which is disposed on a principal surface of the semiconductor substrate. The capacitor includes a lower electrode film disposed on the principal surface of the semiconductor substrate, a dielectric film disposed on the lower electrode and an upper electrode film disposed on the dielectric film. The semiconductor device further includes an interconnection film which includes a portion disposed on the upper electrode film so as to be electrically coupled to the upper electrode film. Directions of residual stresses of the upper electrode film coincide with directions of residual stresses of the portion of the interconnection film. Each of the upper electrode film and the interconnection film may include at least one of platinum and iridium. Also, there is provided a method of manufacturing the semiconductor device.

2 Claims, 2 Drawing Sheets

SEMICONDUCTOR DEVICE WHICH INCLUDES A CAPACITOR AND AN INTERCONNECTION FILM COUPLED TO EACH OTHER AND A MANUFACTURING METHOD THEREOF

CROSS-REFERENCE TO RELATED APPLICATIONS

This is a divisional application of application Ser. No. 11/172,973, filed on Jul. 5, 2005, which is hereby incorporated by reference in its entirety for all purposes.

BACKGROUND OF THE INVENTION

1. Field of the Invention

The present invention relates to a semiconductor device and a manufacturing method of the semiconductor device, in particular, to a semiconductor device which includes a capacitor and an interconnection film which is electrically coupled to the capacitor and a manufacturing method of the semiconductor device. This is a counterpart of and claims priority to Japanese Patent Application No. 2004-218880 filed on Jul. 27, 2004, which is herein incorporated by reference.

2. Description of the Related Art

A capacitor which includes a metal-oxide dielectric, in particular, a ferroelectric metal-oxide as a capacitance insulating film is an important element for a memory circuit which uses a ferroelectric material. Strontium Bismuthic Tantalate (SBT: $SrBi_2Ta_2O_9$) which is a bismuthic stratified compound and Lead Zirconate Titanate (PZT: $Pb(Ti, Zr)O_3$) have been put to practical use. Also, Bismuthic Lanthanum Titanate (BLT: $(Bi, La)_4Ti_3O_{12}$) has been researched. When the capacitor is made from the ferroelectric oxide, the capacitor requires annealing at a high temperature (which ranges from 600 to 800 degrees centigrade) in the presence of oxygen in order to restore the characteristics of the sintered or etched ferroelectric. A noble metal such as platinum or iridium which has a high oxidation resistance is therefore used for both of upper and lower electrodes of the capacitor. In particular, platinum is the most often used because it has a higher stability in the process and it is easier to etch. On the other hand, a laminated interconnection structure which includes a plurality of kinds of metallic material is often used as a metallic interconnection which is coupled to the capacitor, in view of reactivity with the upper electrode of platinum. The laminated interconnection structure is, for example, described in pages 2 through 3 and FIG. 1 of a Patent Document 1 (Japanese Patent 3,157,012). The laminated interconnection structure described in Patent Document 1 consists of three films, that is, a titanium nitride film which is a refractory conductive film, an aluminum-silicon alloy film which is a main interconnection film and another titanium nitride film which is an antireflective film.

Generally, the noble metallic material as represented by platinum has a low degree of reactivity to other materials. Therefore, a boundary separation easily occurs at an interface between the noble metallic material and the other material, for example, the ferroelectric or an insulating layer. Especially, a metallic interconnection film, which is coupled to the upper electrode of the capacitor including the noble metallic material, has a residual stress which causes the boundary separation at the metallic interconnection film and the upper electrode of the capacitor.

Meanwhile, platinum which represents the noble metallic material excessively reacts with aluminum which is often used as the interconnection film through thermal treatment. It is known that the excessive reaction induces quality deterioration of the aluminum interconnection film. In order to suppress the quality deterioration, a barrier metallic film is generally formed between the aluminum interconnection film and the platinum upper electrode. The barrier metallic film includes titanium nitride. Alternatively, a single film including titanium nitride may be used as the metallic interconnection film. However, a direction of residual stress of the titanium nitride film is different than a direction of residual stress of the upper electrode including the platinum. That is, the titanium nitride film has a compressive residual stress and the upper electrode including the platinum has a tensile residual stress against a principal surface of a semiconductor substrate. As a result, the above-described boundary separation may easily arise.

FIG. 1 is a schematic sectional view for describing a semiconductor device 1A which has a capacitor and a metallic interconnection film coupled to each other in the related art. The semiconductor device 1A has a semiconductor substrate 1, a first interlayer insulating film 2, a lower electrode 3, a capacitance insulating film 4, an upper electrode 5, a second interlayer insulating film 6, a third interlayer insulating film 8 and a metallic interconnection film 10. The lower electrode 3, the capacitance insulating film 4 and the upper electrode 5 constitute the capacitor. The metallic interconnection film 10 includes titanium nitride and is coupled to the upper electrode 5 of the capacitor. In FIG. 1, the arrows represent directions of residual stresses in the capacitor and the metallic interconnection film 10. The residual stresses directions of the lower electrode 3, the capacitance insulating film 4 and the upper electrode 5 are the same as one another, that is, these stresses constitute tensile residual stresses against a principal surface of the semiconductor substrate 1. Meanwhile, the residual stress of the metallic interconnection film 10 which includes the titanium nitride is a compressive residual stress against the principal surface of the semiconductor substrate 1. That is, the direction of residual stress of the metallic interconnection film 10 is different than the residual stresses of the upper electrode, the capacitance insulating film and the lower electrode. The difference between the above-described residual stresses may cause the boundary separation at an interface A between the second interlayer insulating film 6 and the upper electrode 5, an interface between B the upper electrode 5 and the capacitance insulating film 4, an interface C between the capacitance insulating film 4 and the lower electrode 3, or an interface D between the lower electrode 3 and the first interlayer insulating film 2. For example, adhesiveness between the metallic interconnection film 10 and the second interlayer insulating film 6 is greater than adhesiveness between the upper electrode 5 and the second interlayer insulating film 6, and the metallic interconnection film 10 pulls upward the second interlayer insulating film 6 in a contact hole 9. As a result, the boundary separation between the metallic interconnection film 10 and the second interlayer insulating film 6 arises at a sidewall of the contact hole 9. Also, a shearing stress at a bottom of the contact hole 9 accelerates the boundary separation.

As seen in the Patent Document 1, the laminated interconnection film has three films that include a lower titanium nitride film which has the compressive residual stress, a middle aluminum-silicon alloy film which has the tensile residual stress and an upper titanium nitride film which has the compressive residual stress. Thus, a whole stress of the laminated interconnection film is controlled by the three films so that the distortion of the semiconductor substrate 1 may be decreased. In the Patent Document 1, the above-described stresses cancel one another only by themselves without using any other residual stresses of other configuration patterns such as the residual stress of the capacitor. Also, the Patent Document 1 does not disclose at all any adverse effects of the residual stress of the metallic interconnection film 10 to the other configuration patterns, for example, the boundary separation.

SUMMARY OF THE INVENTION

An object of the present invention is to suppress the boundary separation from arising between the interconnection film and the upper electrode film or the interlayer insulating film.

According to an aspect of the present invention, for achieving the above-mentioned object, there is provided a semiconductor device which includes a semiconductor substrate and a capacitor which is disposed on a principal surface of the semiconductor substrate. The capacitor includes a lower electrode film disposed on the principal surface of the semiconductor substrate, a dielectric film disposed on the lower electrode and an upper electrode film disposed on the dielectric film. The semiconductor device further includes an interconnection film which includes a portion disposed on the upper electrode film so as to be electrically coupled to the upper electrode film. Directions of residual stresses of the upper electrode film coincide with directions of residual stresses of the portion of the interconnection film.

According to another aspect of the present invention, for achieving the above-mentioned object, there is provided a semiconductor device which includes a semiconductor substrate and a capacitor disposed on a principal surface of the semiconductor substrate. The capacitor includes a lower electrode film disposed on the principal surface of the semiconductor substrate, a dielectric film disposed on the lower electrode and an upper electrode film disposed on the dielectric film. The upper electrode film includes at least one of platinum and iridium. The semiconductor device further includes an interconnection film which includes a portion disposed on the upper electrode film so as to be electrically coupled to the upper electrode film. The portion of the interconnection film includes at least one of platinum and iridium.

According to the other aspect of the present invention, for achieving the above-mentioned object, there is provided a manufacturing method of a semiconductor device. In the manufacturing method, a semiconductor substrate having a principal surface is provided. Next, a lower electrode film is formed on the principal surface of the semiconductor substrate, a dielectric film is formed on the lower electrode, and an upper electrode film is formed on the dielectric film. Directions of residual stresses of the upper electrode film are parallel to the principal surface of the semiconductor substrate. Then, an interconnection film is formed on the upper electrode film so as to be electrically connected to the upper electrode film. Directions of residual stresses of the interconnection film is the same as the directions of the residual stresses of the upper electrode film.

According to the other aspect of the present invention, for achieving the above-mentioned object, there is provided a manufacturing method of a semiconductor device. In the manufacturing method, a semiconductor substrate having a principal surface is provided. Next, a lower electrode film is formed on the principal surface of the semiconductor substrate, a dielectric film is formed on the lower electrode, and an upper electrode film is formed on the dielectric film. The upper electrode film includes at least one of platinum and iridium. Then, an interconnection film is formed on the upper electrode film so as to be electrically connected to the upper electrode film. The interconnection film includes at least one of platinum and iridium.

The above and further aspects and novel features of the invention will more fully appear from the following detailed description, appended claims and the accompanying drawings.

DETAILED DESCRIPTION OF THE PREFERRED EMBODIMENTS

Embodiments of the present invention will be described hereinafter with references to the accompanying drawings. The drawings used for this description illustrate major characteristic parts of embodiments in order that the present invention will be easily understood. However, the invention is not limited by these drawings.

Figure 1:
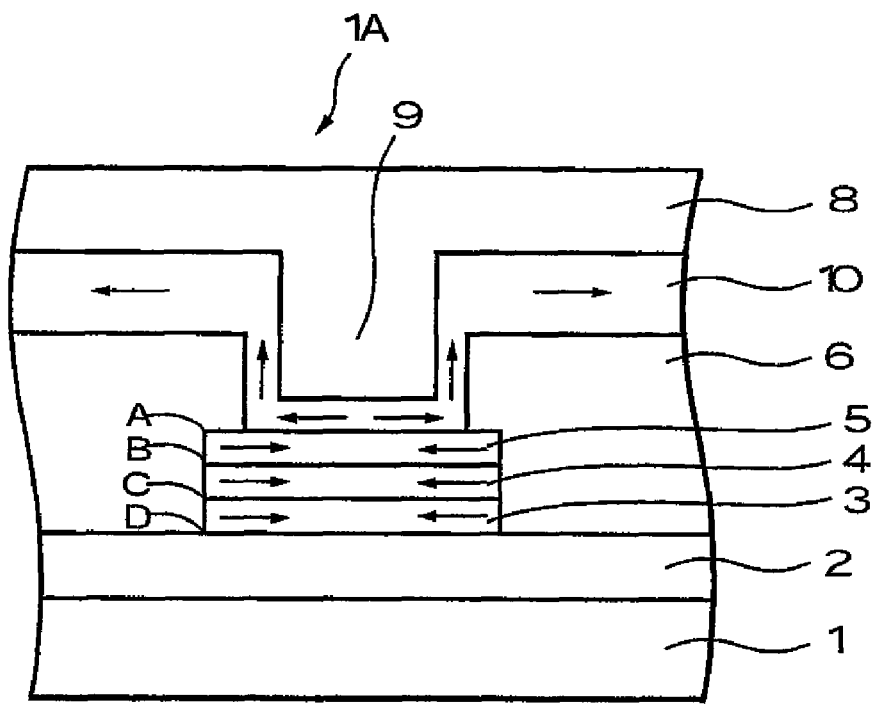
FIG. 1 is a schematic sectional view for describing a semiconductor device which includes a capacitor and a metallic interconnection film coupled to each other in the related art.
Figure 2:
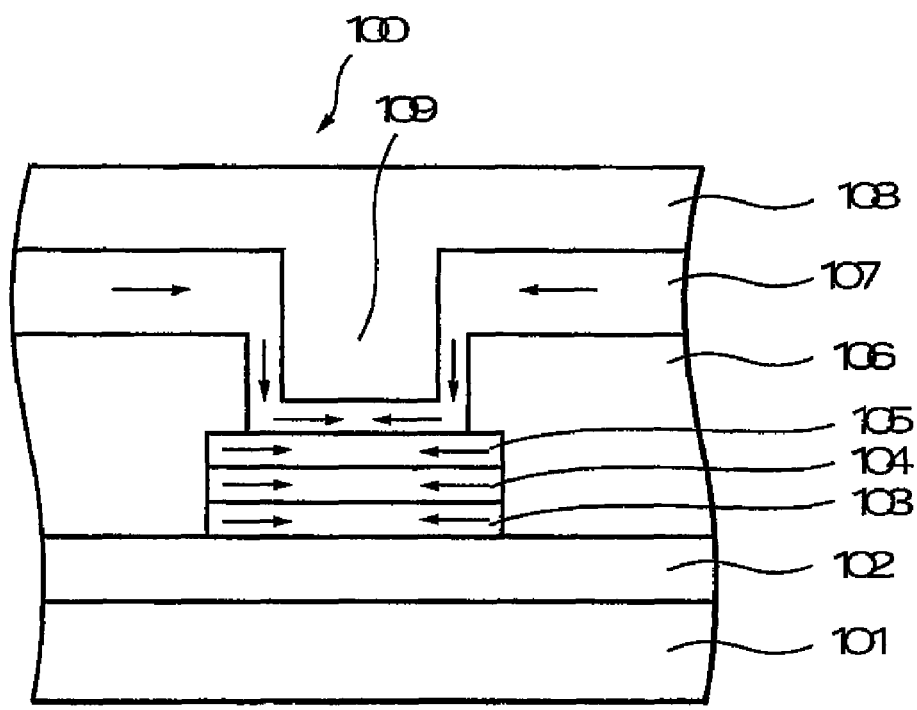
FIG. 2 is a schematic sectional view for describing a semiconductor device which includes a capacitor and a metallic interconnection film coupled to each other according to a first preferred embodiment of the present invention.

FIG. 2 is a schematic sectional view for describing a semiconductor device 100 which includes a capacitor and a metallic interconnection film coupled to each other according to a first preferred embodiment of the present invention. The semiconductor device 100 includes a semiconductor substrate 101, a first interlayer insulating film 102, a lower electrode film 103, a capacitance insulating film 104 including a ferroelectric material, an upper electrode film 105, a second interlayer insulating film 106, a metallic interconnection film 107 and a third interlayer insulating film 108. Also, the semiconductor device 100 includes a semiconductor element such as a transistor and includes another interconnection film coupled to the lower electrode film 103. The first through third interlayer insulating films 102, 106 and 108 respectively include silicon dioxide films. Alternatively, those insulating films 102, 106 and 108 may include Phosphorous Silicate Glass (PSG) film which is a silicon dioxide film including phosphorous or include Boron Phosphorous Silicate Glass (BPSG) film which is a silicon dioxide including boron. The first interlayer insulating film 102 is formed on a principal surface of the semiconductor substrate 101. The capacitor which includes the lower electrode film 103, the capacitance insulating film 104 and the upper electrode film 105 is disposed on the first interlayer insulating film 102. The second interlayer insulating film 106 is formed on the second interlayer insulating film 102 and the capacitor so that an upper surface of the upper electrode film 105 is exposed from a contact hole 109 in the second interlayer insulating film 102. The metallic interconnection film 107 is formed on the upper electrode film 105 of the capacitor and the second interlayer insulating film 106. The third interlayer insulating film 108 is formed on the second interlayer insulating film 106 so as to cover the metallic interconnection film 107. In FIG. 2, the arrows represent directions of residual stresses in the capacitor and the metallic interconnection film 107.

The lower electrode film 103 is generally made from a noble metal such as platinum or iridium or from conductive oxide which has conducting properties in an oxidation state. That is, the lower electrode film 103 is usually made from materials which have a high oxidation resistance, because the capacitor requires annealing at a high temperature (which ranges from 600 to 800 degrees centigrade) in the presence of oxygen in order to restore the characteristics of the sintered or etched ferroelectric. The lower electrode film 103 has tensile residual stresses against the principal surface of the semiconductor substrate 101. In addition, the lower electrode film 103 may have a lamination structure which includes a titanium aluminum nitride film, an iridium film, an iridium oxide film and a platinum film from bottom to top. Hereupon, the titanium aluminum nitride film is a barrier film against a lower metallic interconnection film such as a tungsten plug, the iridium film is an anti-transmission film against oxygen, and the iridium oxide film suppresses the platinum film from reacting chemically with the iridium film.

As described above, the capacitance insulating film 104 includes a ferroelectric material. In this example, the capacitance insulating film 104 is made from Strontium Bismuthic Tantalate (SBT: $SrBi_2Ta_2O_9$), Lead Zirconate Titanate (PZT: $PbCTi, Zr)O_3$) and Bismuthic Lanthanum Titanate (BLT: $(Bi, La)_4Ti_3O_{12}$). Hereupon, the SBT also includes an SBT whose composition is altered or an SBT which contains additives. Likewise, the PZT also includes a PZT whose composition is altered or a PZT which contains additives, and the BLT also includes a BLT whose composition is altered or a BLT which contains additives. Alternatively, the capacitance insulating film 104 may include metal-oxide dielectric which has a high permittivity. The capacitance insulating film 104 has tensile residual stresses against the principal surface of the semiconductor substrate 101.

The upper electrode film 105 is generally made from the noble metal such as platinum or iridium or from conductive oxide which has the conducting properties in the oxidation state, as well as the lower electrode film 103. The upper electrode film 105 is usually made from platinum, because the platinum has a higher stability in the process and the platinum is easier to etch. Alternatively, the upper electrode film 105 may include a lamination structure which includes platinum and iridium. The upper electrode film 105 has tensile residual stresses against the principal surface of the semiconductor substrate 101. That is, directions of the residual stresses of the upper electrode film 105 coincide with directions of the residual stresses of the lower electrode film 103 and the capacitance insulating film 104. In addition, the above-described tensile residual stresses act so that the capacitor is convexly distorted against the principal surface of the semiconductor substrate 101. Furthermore, the directions of the above-described tensile residual stresses are parallel to the principal surface of the semiconductor substrate 101.

The metallic interconnection film 107 is a single-layer film which includes one of the noble metals such as platinum, iridium and iridium oxide. Alternatively, the metallic interconnection film 107 may be a film stack which includes at least two of platinum, iridium and iridium oxide. The metallic interconnection film 107 includes a portion disposed on the upper electrode film 105 so as to be electrically coupled to the upper electrode film 105. When the metallic interconnection film 107 is made from the above-described noble metal, the metallic interconnection film 107 has tensile residual stresses against the principal surface of the semiconductor substrate 101. That is, the directions of the residual stresses of the metallic interconnection film 107 coincide with the directions of the residual stresses of the lower electrode film 103, the capacitance insulating film 104 and the upper electrode film 105. Accordingly, the metallic interconnection film 107 is suppressed from pulling upward the second interlayer insulating film 106 in the contact hole 109. Therefore, the boundary separation between the metallic interconnection film 107 and the second interlayer insulating film 106 may be suppressed from arising at a sidewall of the contact hole 109. Also, since the metallic interconnection film 107 has the tensile residual stress as well as the upper electrode film 105, a shearing stress between the metallic interconnection film 107 and the upper electrode film 105 is decreased at a bottom of the contact hole 109. Therefore, the boundary separation between the metallic interconnection film 107 and the upper electrode film 105 may be suppressed from arising. Furthermore, when the upper electrode film 105 includes platinum, adhesiveness between the metallic interconnection film 107 and the upper electrode film 105 may be improved.

The manufacturing method of the semiconductor device 100 is described below.

At first, the first interlayer insulating film 102 is formed on the principal surface of the semiconductor substrate 101 by a Chemical Vapor Deposition (CVD) method. A film stack is formed on the first interlayer insulating film 102 by sequentially depositing the titanium aluminum nitride film, the iridium film, the iridium oxide film and the platinum film by a sputtering method. Next, a ferroelectric film such as an SBT film is formed on the film stack. In this example, the ferroelectric film is formed by firing after the film stack is spin coated with a precursor solution. Then, a platinum film is formed on the ferroelectric film by the sputtering method. Alternatively, a film stack which includes a platinum film, an iridium film and an iridium oxide film may be formed on the ferroelectric film. Thereafter, the film stack, the ferroelectric film and the platinum film are sequentially patterned by photolithography and etching methods, and thus, the lower electrode film 103 which includes the titanium aluminum nitride film, the iridium film, the iridium oxide film and the platinum film, the capacitance insulating film 104 which includes the ferroelectric film and the upper electrode film 105 which includes the platinum film are formed on the first interlayer insulating film 102. The lower electrode film 103, the capacitance insulating film 104 and the upper electrode film 105 constitute the capacitor. After the patterning, the second interlayer insulating film 106 is formed on the first interlayer insulating film 102 and the capacitor. Then, the contact hole 109 is formed in the second interlayer insulating film 106 by the photolithography and etching methods so that the upper surface of the upper electrode film 105 is exposed from the second interlayer insulating film 106. After forming the contact hole 109, a platinum layer is deposited on the second interlayer insulating film and the upper surface of the upper electrode film 105 in the contact hole 109 by the sputtering method. The platinum layer is patterned by the photolithography and etching methods in order to form the metallic interconnection film 107. Then, the third interlayer insulating film 108 is formed on the metallic interconnection film 107 and the second interlayer insulating film 106.

According to the first preferred embodiment, the semiconductor device includes the interconnection film which has the same residual stress as each of the lower electrode film, the capacitance insulating film and the upper electrode film. Therefore, the boundary separation between the interconnection film and the second interlayer insulating film may be suppressed from arising at a sidewall of the contact hole, and the boundary separation between the interconnection film and the upper electrode film may be suppressed. Furthermore, when the interconnection film and the upper electrode film concurrently includes one of the noble metals such as platinum, iridium and iridium oxide, the above-described boundary separations may be suppressed with the adhesiveness improved between the interconnection film and the upper electrode film.

Figure 3:
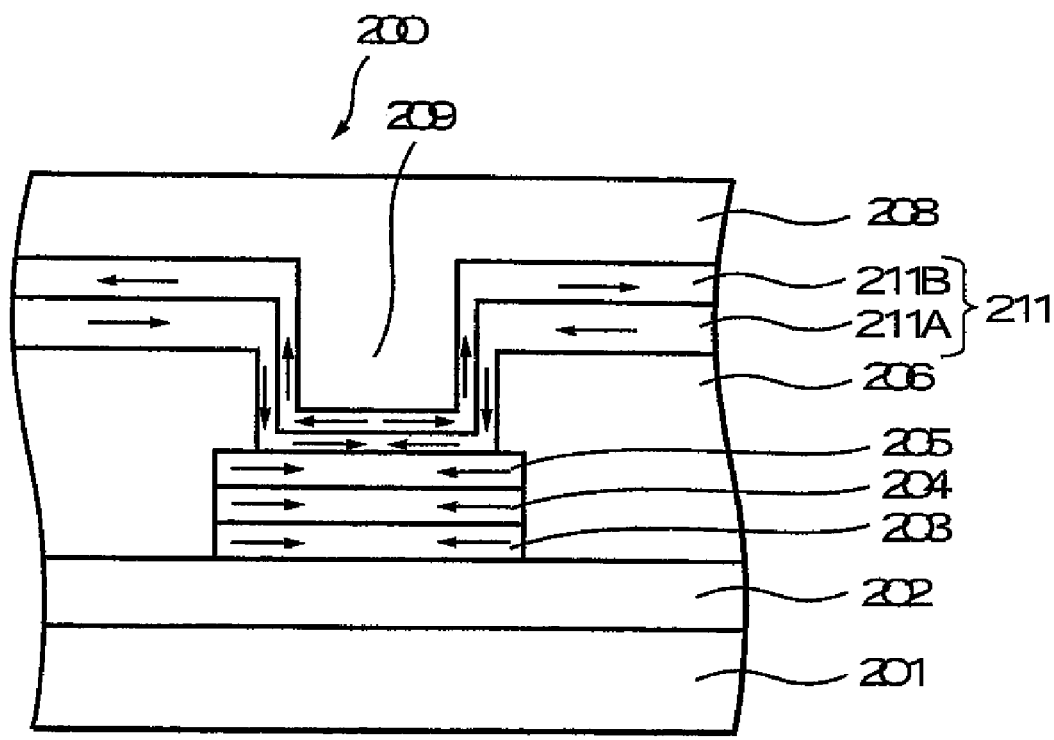
FIG. 3 is a schematic sectional view for describing a semiconductor device which includes a capacitor and a laminated metallic interconnection film coupled to each other according to a second preferred embodiment of the present invention.

FIG. 3 is a schematic sectional view for describing a semiconductor device 200 which includes a capacitor and a laminated metallic interconnection film coupled to each other according to a second preferred embodiment of the present invention. The semiconductor device 200 according to the second preferred embodiment includes a laminated metallic interconnection film 211 which includes a first metallic interconnection film 211A and a second metallic interconnection film 211B. The other configurations of the semiconductor device 200 according to the second preferred embodiment are the same as those of the semiconductor device 100 according to the first preferred embodiment.

The first metallic interconnection film 211A is formed on the upper electrode film 205 of the capacitor and the second interlayer insulating film 206. The first metallic interconnection film 211A is a single-layer film which includes one of the noble metals such as platinum, iridium and iridium oxide. Alternatively, the first metallic interconnection film 211A may be a film stack which includes at least two of platinum, iridium and iridium oxide. The first metallic interconnection film 211A includes first residual stresses. When the first metallic interconnection film 211A is made from the above-described noble metal, the first residual stresses are tensile residual stresses against the principal surface of the semiconductor substrate 201. The second metallic interconnection film 211B is formed on the first metallic interconnection film 211A so as to extend along the first metallic interconnection film 211A. The second metallic interconnection film 211B is a titanium nitride film and has second residual stresses. The directions of the second residual stresses are opposite to the directions of the first residual stresses. That is, the second residual stresses are compressive residual stresses against the principal surface of the semiconductor substrate 201. The compressive residual stresses act so that the second metallic interconnection film 211B is concavely distorted against the principal surface of the semiconductor substrate 201. In FIG. 3, the arrows represent directions of the residual stresses in the capacitor and the first and second metallic interconnection film 211A and 211B. In this example, the first and second metallic interconnection films 211A and 211B are formed by sequentially depositing a platinum layer and a titanium nitride layer on the upper electrode film 205 and the second interlayer insulating film 206 using the sputtering method and by patterning the platinum layer and the titanium layer using the photolithography and etching methods.

In the laminated metallic interconnection film 211 of the semiconductor device 102, since the directions of the tensile residual stresses of the first metallic interconnection film 211A are opposite to the directions of the compressive residual stresses of the second metallic interconnection film 211B, the residual stress of the first metallic interconnection film 211A and the residual stress of the second metallic interconnection film 211B cancel each other out. That is, the tensile residual stresses of the first metallic interconnection film 211A are negated by the compressive residual stresses of the second metallic interconnection film 211B. Accordingly, the first metallic interconnection film 211A is suppressed from pulling upward the second interlayer insulating film 206 in the contact hole 209. Therefore, the boundary separation between the first metallic interconnection film 211A and the second interlayer insulating film 206 may be suppressed at the sidewall of the contact hole 209. Also, since the tensile residual stresses of the first metallic interconnection film 211A are negated by the compressive residual stresses of the second metallic interconnection film 211B, the shearing stress between the first metallic interconnection film 211A and the upper electrode film 205 is decreased at the bottom of the contact hole 209. Therefore, the boundary separation between the first metallic interconnection film 211A and the upper electrode film 205 may be suppressed.

When the upper electrode film 205 includes platinum, adhesiveness between the metallic interconnection film 211A and the upper electrode film 205 may be improved. Also, when the first metallic interconnection film 211A is the single-layer film which includes one of iridium and iridium oxide or the film stack which includes at least two of platinum, iridium and iridium oxide, the above-described boundary separation may be suppressed. Furthermore, since the second metallic interconnection film 211B is the titanium nitride film, adhesiveness between the laminated metallic interconnection film 211 and the third interlayer insulating film 208 may be increased and metal pollution may be suppressed in an etching apparatus.

Next, the relationship of thickness, between the first metallic interconnection film 211A which has the tensile residual stresses and the second metallic interconnection film 211B which has the compressive residual stresses, is described below. In this example, the relationship of thickness is determined, based on degrees of stress between the platinum film of the first metallic interconnection film 211A and the titanium nitride film of the second metallic interconnection film 211B under room temperature and heat treatment temperature. Hereupon, the heat treatment temperature is, for example, 400 degrees centigrade, at which the heat treatment is executed after forming the laminated metallic interconnection film 211. Also, since the magnitude of the residual stress of the titanium nitride film depends on the degree of nitriding in the titanium nitride film, first and second assumptions are made with respect to the residual stress of the titanium nitride film in this example. That is, the first assumptions is that a first titanium nitride film TiN1 includes a lower degree of nitriding as a result of film-forming conditions for lower stresses. The second assumption is that a second titanium nitride film TiN2 includes higher degree of nitriding as a result of film-forming conditions for higher stresses.

Under room temperature, the platinum film has the residual stresses Sroom(Pt) whose value is $1 \times 10^{10}$ dyne/cm$^2$, the first titanium nitride film TiN1 has the residual stress Sroom(TiN1) whose value is $5 \times 10^9$ dyne/cm$^2$, and the second titanium nitride film TiN2 has the residual stress Sroom(TiN2) whose value is $3 \times 10^{10}$ dyne/cm$^2$. Therefore, a ratio Rroom1 of the residual stress Sroom(TiN1) to the residual stresses Sroom(Pt) and a ratio Rroom2 of the residual stress Sroom(TiN2) to the residual stresses Sroom(Pt) are respectively described as shown in following equations (1) and (2).

$$R\text{room1} = S\text{room}(TiN1)/S\text{room}(Pt) = 0.5 \quad (1)$$

$$R\text{room2} = S\text{room}(TiN2)/S\text{room}(Pt) = 3 \quad (2)$$

On the other hand, under the heat treatment temperature (400 degrees centigrade), the platinum film has the residual stresses Sheat(Pt) whose value is $6 \times 10^9$ dyne/cm$^2$, the first titanium nitride film TiN1 has the residual stress Sheat(TiN1) whose value is $1 \times 10^{10}$ dyne/cm$^2$, and the second titanium nitride film TiN2 has the residual stress Sheat(TiN2) whose value is $3.5 \times 10^{10}$ dyne/cm$^2$. Therefore, a stress ratio Rheat1 of the residual stress Sheat(TiN1) to the residual stresses Sheat(Pt) and a stress ratio Rheat2 of the residual stress Sheat (TiN2) to the residual stresses Sheat(Pt) are respectively described as shown in following equations (3) and (4).

$$Rheat1 = Sheat(TiN1)/Sheat(Pt) \approx 1.67 \quad (3)$$

$$Rheat2 = Sheat(TiN2)/Sheat(Pt) \approx 5.83 \quad (4)$$

Considering the equations (1) and (3), a ratio Rd1 of a thickness of the platinum film to a thickness of the first titanium nitride film TiN1 ranges approximately from 0.5 to 1.67. Likewise, considering the equations (2) and (4), a ratio Rd2 of a thickness of the platinum film to a thickness of the second titanium nitride film TiN2 ranges approximately from 3 to 5.83. Furthermore, considering the ratios Rd1 and Rd2, a ratio of the platinum film to a thickness of a titanium nitride film which includes the first and second titanium nitride films TiN1 and TiN2 ranges approximately from 0.5 to 5.83. Accordingly, when it is assumed that the first metallic interconnection film 211A has a first thickness DA and the second metallic interconnection film 211B has a second thickness DB, a ratio of the first thickness DA to the second thickness DB ranges approximately from 0.5 to 5.83.

According to the second preferred embodiment, the directions of the second residual stresses of the second interconnection film is opposite to the directions of the first residual stresses of the first interconnection film. Therefore, the first residual stresses are negated by the second residual stresses. As a result, the boundary separation may be suppressed between the first interconnection film and the second interlayer insulating film or the upper electrode film. Also, when the first interconnection film and the upper electrode film respectively include the same metallic materials, the adhesiveness may be improved between the first interconnection film and the upper electrode film. Furthermore, since the second interconnection film is the titanium nitride film, the adhesiveness between the laminated interconnection film and the third interlayer insulating film may be increased and the metal pollution may be suppressed in the etching apparatus.

Figure 4:
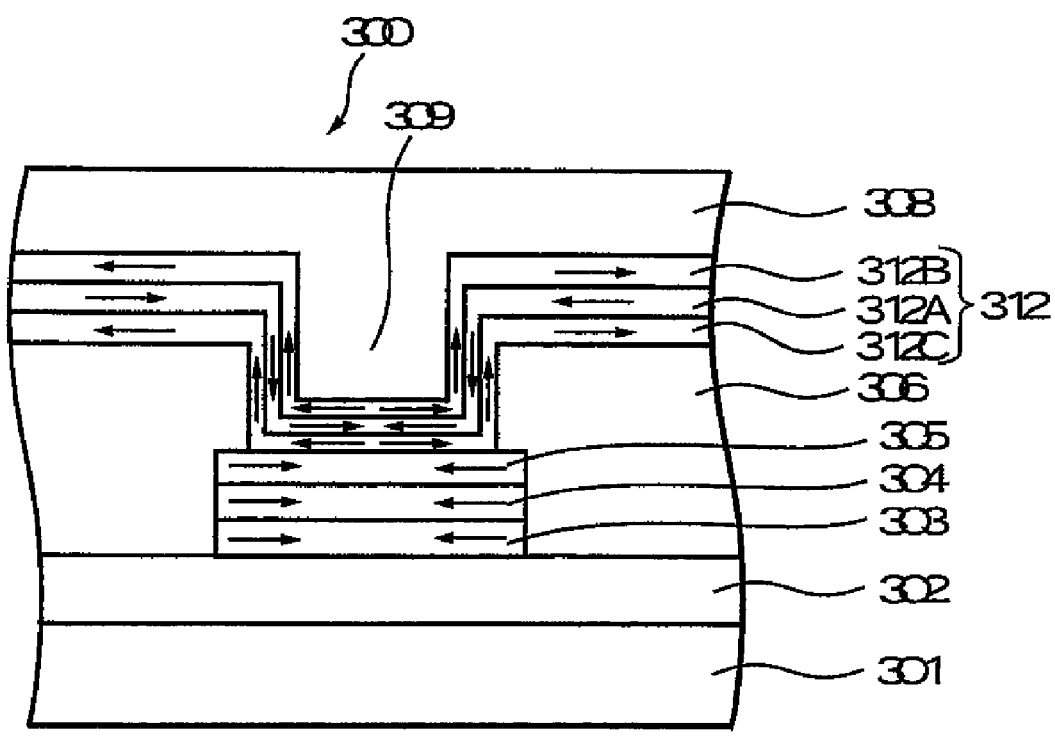
FIG. 4 is a schematic sectional view for describing a semiconductor device which includes a capacitor and a laminated metallic interconnection film coupled to each other according to a third preferred embodiment of the present invention.

FIG. 4 is a schematic sectional view for describing a semiconductor device 300 which includes a capacitor and a laminated metallic interconnection film 312 coupled to each other according to a third preferred embodiment of the present invention. The semiconductor device 103 according to the third preferred embodiment includes the laminated metallic interconnection film 312 which includes first through third metallic interconnection films 312A through 312C. The other configurations of the semiconductor device 300 according to the third preferred embodiment are the same as those of the semiconductor device 100 according to the first preferred embodiment.

The third metallic interconnection film 312C is formed on the upper electrode film 305 of the capacitor and the second interlayer insulating film 306. The third metallic interconnection film 312C is a titanium nitride film and has third residual stresses. The first metallic interconnection film 312A is formed on the third metallic interconnection film 312C so as to extend along the third metallic interconnection film 312C. The first metallic interconnection film 312A is a single-layer film which includes one of the noble metals such as platinum, iridium and iridium oxide. Alternatively, the first metallic interconnection film 312A may be a film stack which includes at least two of platinum, iridium and iridium oxide. The first metallic interconnection film 312A has a first residual stress. When the first metallic interconnection film 312A is made from the above-described noble metal, the first residual stress is a tensile residual stress against the principal surface of the semiconductor substrate 301. The directions of the first residual stresses are opposite to the directions of the third residual stresses. The third residual stresses are compressive residual stresses. The second metallic interconnection film 312B is formed on the first metallic interconnection film 312A so as to extend along the first metallic interconnection film 312A. The second metallic interconnection film 312B is a titanium nitride film and has second residual stresses. The directions of the second residual stresses are opposite to the directions of the first residual stresses. That is, the second residual stresses are compressive residual stresses against the principal surface of the semiconductor substrate 301. The compressive residual stresses act so that the second metallic interconnection film 312B is concavely distorted against the principal surface of the semiconductor substrate 301. In FIG. 4, the arrows represent directions of the residual stresses in the capacitor and the first through third metallic interconnection films 312A through 312C. In this example, the first through third metallic interconnection films 312A through 312C are formed by sequentially depositing a titanium nitride layer, a platinum layer and another titanium nitride layer on the upper electrode film 305 and the second interlayer insulating film 306 using the sputtering method and by patterning the titanium nitride layer, the platinum layer and the other titanium layer using the photolithography and etching methods.

In the laminated metallic interconnection film 312 of the semiconductor device 300, the directions of the compressive residual stresses of the second and third metallic interconnection films 312B and 312C are opposite to the directions of the tensile residual stresses of the first metallic interconnection film 312A. Therefore, the tensile residual stresses of the first metallic interconnection film 312A and the compressive residual stresses of the second and third metallic interconnection films 312B and 312C cancel each other out. That is, the tensile residual stresses of the first metallic interconnection film 312A are negated by the compressive residual stresses of the second and third metallic interconnection films 312B and 312C. Accordingly, the first metallic interconnection film 312A is suppressed from pulling upward the second interlayer insulating film 306 in the contact hole 309. Therefore, the boundary separation between the laminated metallic interconnection film 312 and the second interlayer insulating film 306 may be suppressed at the sidewall of the contact hole 309. Also, since the tensile residual stresses of the first metallic interconnection film 312A are negated by the compressive residual stresses of the second and third metallic interconnection films 312B and 312C, the shearing stress between the first metallic interconnection film 312A and the upper electrode film 305 is decreased at the bottom of the contact hole 309. Therefore, the boundary separation between the laminated metallic interconnection film 312 and the upper electrode film 305 may be suppressed. Also, since the second and third metallic interconnection films 312B and 312C are the titanium nitride films, adhesiveness between the laminated metallic interconnection film 312 and the second and third interlayer insulating films 306 and 308 may be increased and metal pollution may be suppressed in an etching apparatus.

In this example, the relationship of thickness is determined, based on degrees of stress among the platinum film of the first metallic interconnection film 312A, the titanium nitride film of the second metallic interconnection film 311B and the compressive residual stress of the third metallic interconnection film 312C under room temperature and heat treatment temperature, as well as in the second preferred embodiment. That is, when it is assumed that the first metallic interconnection film 312A has a first thickness DA, the second metallic interconnection film 312B has a second thickness DB and the third metallic interconnection film 312C has a third thickness DC, a ratio of the first thickness DA to the second and third thicknesses DB and DC ranges approximately from 0.5 to 5.83.

According to the third preferred embodiment, the semiconductor device includes the first interconnection film which has the first residual stresses and the second and third interconnection films which have the second and third residual stresses, and the directions of the second and third residual stresses extend opposite to the directions of the first residual stresses. Therefore, the first residual stresses are negated by the second and third residual stresses. As a result, the boundary separation may be suppressed between the laminated interconnection film and the second interlayer insulating film or the upper electrode film. Also, since the first interconnection film is located between the second and third interconnection films which are the titanium nitride films, the adhesiveness between the laminated interconnection film and the second and third interlayer insulating films may be increased and the metal pollution may be suppressed in the etching apparatus.

What is claimed is:

1. A semiconductor device, comprising:
    a semiconductor substrate having a principal surface;
    a lower electrode film disposed on the principal surface of the semiconductor substrate;
    a dielectric film disposed on the lower electrode;
    an upper electrode film disposed on the dielectric film, wherein the lower electrode film, the dielectric film and the upper electrode film constitute a capacitor;
    an interconnection film including a portion disposed on the upper electrode film so as to be electrically coupled to the upper electrode film, wherein directions of residual stresses of the upper electrode film coincide with directions of residual stresses of the portion of the interconnection film,
    wherein the interconnection film is a first interconnection film;
    a second interconnection film disposed on the first interconnection film so as to extend along the first interconnection film, wherein the second interconnection film includes titanium nitride,
    wherein a ratio of a thickness of the first interconnection film to a thickness of the second interconnection film ranges from 0.5 to 5.83;
    an insulating film disposed on the second interconnection film so as to cover the first and second interconnection films and the capacitor, wherein the insulating film is attached to the second interconnection film;
    a third interconnection film disposed between the upper electrode film and the first interconnection film so as to extend along the first interconnection film, wherein the third interconnection film includes titanium nitride; and
    an interlayer insulating film disposed between the third interconnection film and the surface of the semiconductor substrate so as to cover the capacitor with being attached to the third interconnection layer.

2. The semiconductor device according to claim 1, wherein a ratio of a thickness of the first interconnection film to a sum of thicknesses of the second and third interconnection films ranges approximately from 0.5 to 5.83.

* * * * *